(12) United States Patent
Dhanasekaran

(10) Patent No.: US 9,467,100 B2
(45) Date of Patent: Oct. 11, 2016

(54) REFERENCE AMPLIFIER COUPLED TO A VOLTAGE DIVIDER CIRCUIT TO PROVIDE FEEDBACK FOR AN AMPLIFIER

(71) Applicant: QUALCOMM Incorporated, San Diego, CA (US)

(72) Inventor: Vijayakumar Dhanasekaran, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 32 days.

(21) Appl. No.: 14/334,442

(22) Filed: Jul. 17, 2014

(65) Prior Publication Data

US 2016/0020736 A1    Jan. 21, 2016

(51) Int. Cl.
| | | |
|---|---|---|
| H03F 1/36 | (2006.01) |
| H03F 3/183 | (2006.01) |
| H03F 3/21 | (2006.01) |
| H03F 3/45 | (2006.01) |
| H03F 3/187 | (2006.01) |

(52) U.S. Cl.
CPC .............. *H03F 3/183* (2013.01); *H03F 3/187* (2013.01); *H03F 3/211* (2013.01); *H03F 3/45071* (2013.01); *H03F 3/45475* (2013.01); *H03F 3/45941* (2013.01); *H03F 2200/03* (2013.01); *H03F 2200/156* (2013.01); *H03F 2203/45116* (2013.01); *H03F 2203/45512* (2013.01); *H03F 2203/45521* (2013.01); *H03F 2203/45528* (2013.01)

(58) Field of Classification Search
CPC ................................ H03F 1/36; H03G 3/3026
USPC ............................. 330/85, 86; 381/120, 121
See application file for complete search history.

(56) References Cited

U.S. PATENT DOCUMENTS

| | | | |
|---|---|---|---|
| 3,679,986 A * | 7/1972 | Zaman, III ........... | H03G 3/3015 330/141 |
| 3,708,754 A * | 1/1973 | Diehl ....................... | H03G 3/30 318/619 |
| 4,720,686 A | 1/1988 | Westwick | |
| 6,424,225 B1 | 7/2002 | Choi et al. | |
| 8,063,807 B1 | 11/2011 | Lai et al. | |
| 8,143,868 B2 | 3/2012 | Dasgupta et al. | |
| 8,198,868 B2 | 6/2012 | Pagano | |
| 8,482,099 B2 | 7/2013 | Enjalbert | |
| 8,525,596 B2 | 9/2013 | Johancsik et al. | |
| 8,525,710 B1 | 9/2013 | Tsang et al. | |
| 8,913,692 B1 * | 12/2014 | Copeland ............. | H04B 1/0475 375/297 |
| 2003/0234684 A1 * | 12/2003 | Oppelt ..................... | H03F 1/26 330/85 |
| 2004/0012440 A1 * | 1/2004 | Hughes .................... | H04R 3/00 330/85 |
| 2009/0290728 A1 | 11/2009 | Berg | |

OTHER PUBLICATIONS

International Search Report and Written Opinion—PCT/US2015/039893—ISA/EPO—Sep. 29, 2015, 11 pages.

* cited by examiner

*Primary Examiner* — Steven J Mottola
(74) *Attorney, Agent, or Firm* — Toler Law Group, PC

(57) ABSTRACT

An apparatus includes a voltage divider circuit and a reference amplifier coupled to the voltage divider circuit. The reference amplifier is configured to provide a feedback voltage to input circuitry of an amplifier.

19 Claims, 6 Drawing Sheets

US 9,467,100 B2

REFERENCE AMPLIFIER COUPLED TO A VOLTAGE DIVIDER CIRCUIT TO PROVIDE FEEDBACK FOR AN AMPLIFIER

I. FIELD

The present disclosure is generally related to a reference amplifier coupled to a voltage divider circuit to provide feedback for an amplifier.

II. DESCRIPTION OF RELATED ART

Advances in technology have resulted in smaller and more powerful computing devices. For example, there currently exist a variety of portable personal computing devices, including wireless telephones such as mobile and smart phones, tablets, and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Electronic devices (e.g., wireless telephones, tablets, music players, etc.) may include a coder/decoder (CODEC) to convert digital audio signals into analog audio signals. For example, the CODEC may include a digital-to-analog converter (DAC) configured to generate the analog audio signals, and the CODEC may also include a single-ended power amplifier to amplify the analog audio signals and provide the amplified audio signals to a speaker (e.g., a headphone) coupled to the CODEC. Based on the single-ended nature of the power amplifier, an input of the power amplifier (e.g., an output of the DAC) may have a common mode voltage swing. Resistors having signal-dependent body voltages may increase total harmonic distortion (THD) in the presence of the common mode voltage swing. For example, a feedback path of the power amplifier may include a resistor having a signal-dependent body voltage that produces distortion in the presence of a common mode voltage swing at the input of the power amplifier.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

The techniques described in the detailed description may be implemented in any audio playback device. For example, the techniques described in the detailed description may be implemented within an audio playback device to reduce distortion (e.g., distortion caused by resistors having signal-dependent body voltages in the presence of a common mode swing). Although some embodiments depict the techniques as implemented in a wireless device, the techniques may be implemented in any device capable of playing music or other audio content.

Figure 1:
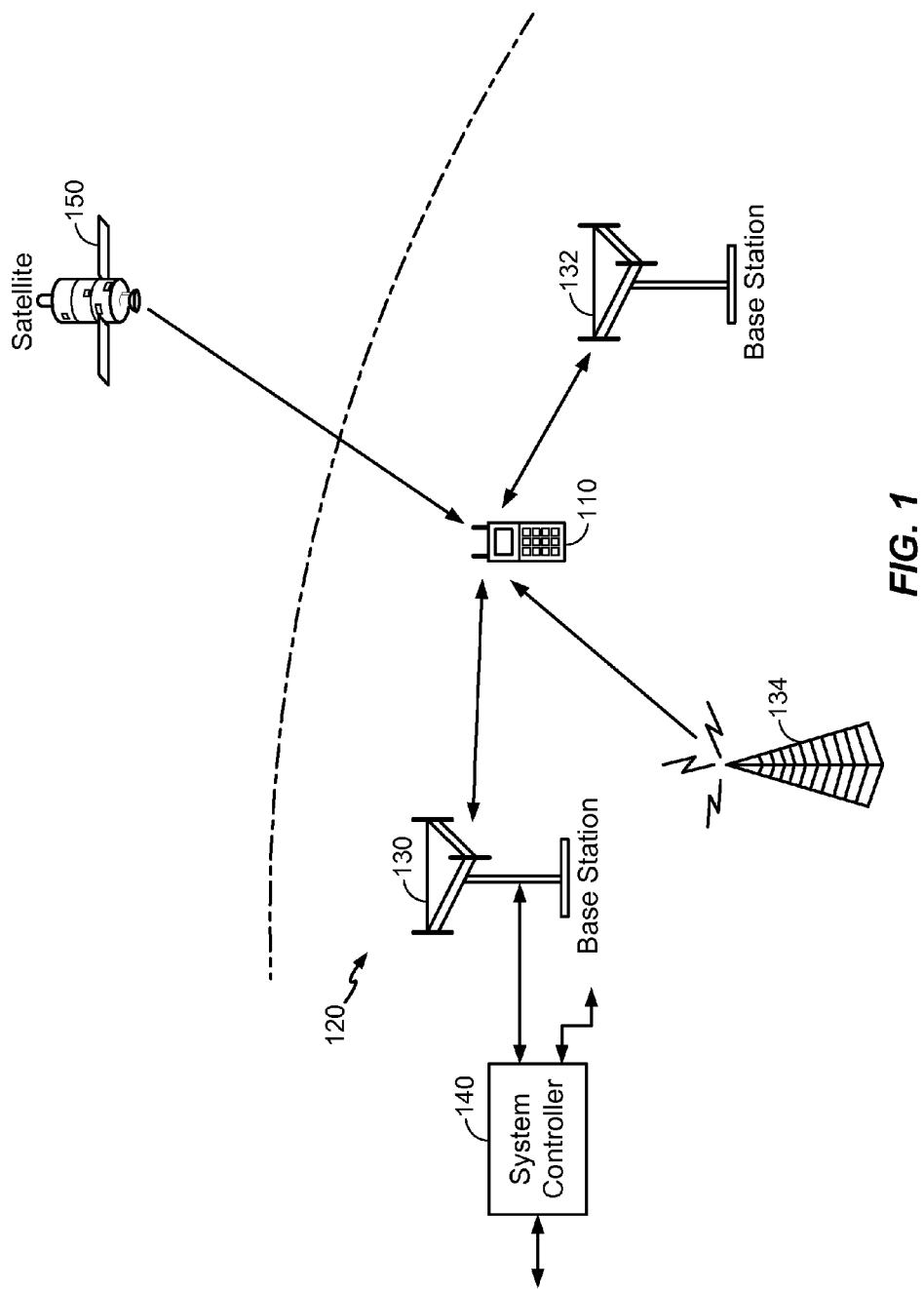
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with the wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Figure 2:
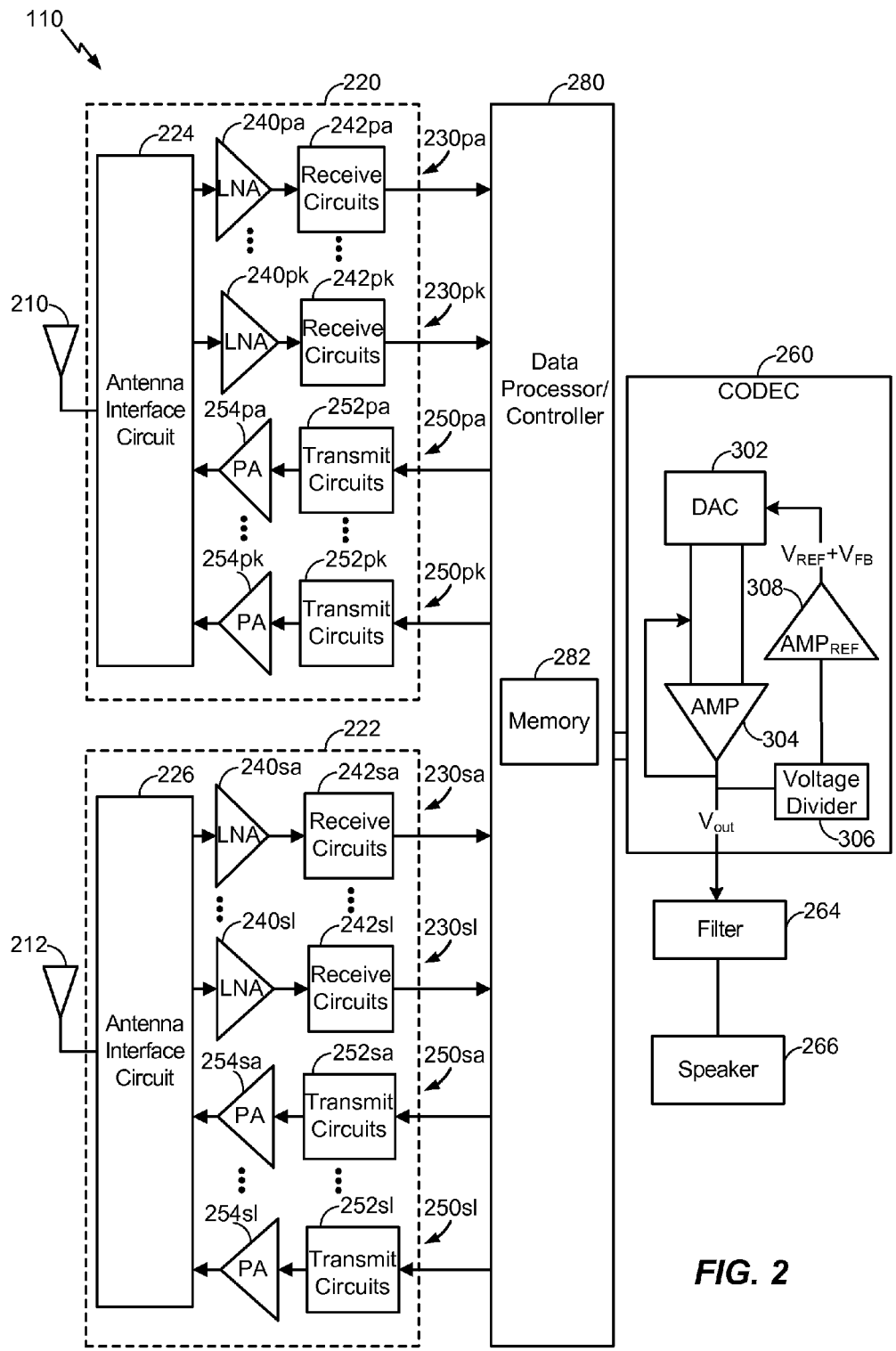
FIG. 2 shows a block diagram of the wireless device in FIG. 1.

In an exemplary embodiment, the wireless device 110 may include any device that is capable of playing music (e.g., a device with music player capabilities). For example, it is not necessary that the wireless device 110 be capable of communicating with other devices within the wireless system 120. It should be noted that the wireless device 110 illustrated in FIGS. 1-2 is used as a non-limiting example of a device in which the techniques described herein may be implemented. Thus, the components and capabilities of the wireless device 110 should not be construed as limiting. The techniques described herein may be implemented in a variety of devices with varying capabilities.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212, and a data processor/controller 280. Transceiver 220 includes multiple (K) receivers 230*pa* to 230*pk* and multiple (K) transmitters 250*pa* to 250*pk* to support multiple frequency bands, multiple radio technologies, carrier aggregation, receive diversity, multiple-input multiple-output (MIMO) transmission from multiple transmit antennas to multiple receive antennas, etc. Transceiver 222 includes multiple (L) receivers 230*sa* to 230*sl* and multiple (L) transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230*pa*-230*pk* and 230*sa*-230*sl* includes an LNA 240*pa*-240*pk* and 240*sa*-240*sl* and receive circuits 242*pa*-242*pk* and 242*sa*-242*sl*, respectively. For data reception, antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below describes the receiver 230*pa* as an example of a selected receiver. Within receiver 230*pa*, the LNA 240*pa* amplifies the input RF signal and provides an output RF signal. Receive circuits 242*pa* downconvert the output RF signal from RF to baseband, amplify and filter the downconverted signal, and provide an analog input signal to the data processor 280. Receive circuits 242*pa* may include mixers, filters, amplifiers, matching circuits, an oscillator, a local oscillator (LO) generator, a phase locked loop (PLL), etc. Each remaining receiver 230*pk* and 230*sa*-230*sl* in transceivers 220 and 222 may operate in a similar manner as the receiver 230*pa*.

In the exemplary design shown in FIG. 2, each transmitter 250*pa*-250*pk* and 250*sa*-250*sl* includes transmit circuits 252*pa*-252*pk* and 252*sa*-252*sl* and a power amplifier (PA) 254*pa*-254*pk* and 254*sa*-254*sl*, respectively. For data transmission, the data processor 280 processes (e.g., encodes and modulates) data to be transmitted and provides an analog output signal to a selected transmitter. The description below describes the transmitter 250*pa* as an example of a selected transmitter. Within transmitter 250*pa*, the transmit circuits 252*pa* amplify, filter, and upconvert the analog output signal from baseband to RF and provide a modulated RF signal. Transmit circuits 252*pa* may include amplifiers, filters, mixers, matching circuits, an oscillator, an LO generator, a PLL, etc. The PA 254*pa* receives and amplifies the modulated RF signal and provides a transmit RF signal having the proper output power level. The transmit RF signal is routed through antenna interface circuit 224 and transmitted via the antenna 210. Each remaining transmitter 250*pk* and 250*sa*-250*sl* in transceivers 220 and 222 may operate in a similar manner as the transmitter 250*pa*.

A receiver and a transmitter may also include other circuits not shown in FIG. 2, such as filters, matching circuits, etc. All or a portion of transceivers 220 and 222 may be implemented using one or more analog integrated circuits (ICs), RF ICs (RFICs), mixed-signal ICs, etc. For example, LNAs 240*pa*-240*pk* and 240*sa*-240*sl* and receive circuits 242*pa*-242*pk* and 242*sa*-242*sl* may be implemented using an RFIC.

Wireless device 110 may support multiple band groups, multiple radio technologies, and/or multiple antennas. Wireless device 110 may include a number of LNAs to support reception via the multiple band groups, multiple radio technologies, and/or multiple antennas.

Data processor/controller 280 may perform various functions for the wireless device 110. For example, the data processor/controller 280 may perform processing for data being received via receivers 230*pa*-230*pk* and 230*sa*-230*sl* and data being transmitted via transmitters 250*pa*-250*pk* and 250*sa*-250*sl*. Data processor/controller 280 may control the operation of the various circuits within transceivers 220 and 222. A memory 282 may store program codes and data for the data processor/controller 280. Data processor/controller 280 may be implemented using one or more application specific integrated circuits (ASICs) and/or other ICs.

A coder/decoder (CODEC) 260 may be coupled to the data processor 280. The CODEC 260 may include a digital-to-analog converter (DAC) 302, an amplifier (AMP) 304, a voltage divider circuit 306, and a reference amplifier (AMP$_{REF}$) 308. The DAC 302 may be configured to receive a digital audio signal from the data processor 280 and to convert the digital audio signal into an analog audio signal. The analog audio signal may be provided to the amplifier 304 (e.g., a power amplifier). The amplifier 304 may amplify the analog audio signal to generate an output voltage signal (Vout) (e.g., an amplified audio signal). The output voltage signal (Vout) may be filtered by a filter 264 and provided to a speaker 266.

The output voltage signal (Vout) may also be provided to the input of the amplifier 304 via a feedback path, causing a common mode voltage swing at the input of the amplifier 304. To reduce distortion caused by one or more resistors having signal-dependent body voltages in the presence of the common voltage swing, the voltage divider circuit 306 may provide a voltage (based on the output voltage (Vout)) to the reference amplifier 308. The voltage divider circuit 306 may be a resistive voltage divider circuit as described with respect to FIG. 4, a capacitive voltage divider circuit as described with respect to FIG. 5, an amplifier circuit, etc. The reference amplifier 308 may generate and provide a reference voltage ($V_{REF}$) and a feedback voltage ($V_{FB}$) to the DAC 302. The feedback voltage ($V_{FB}$) may correspond to a distortion error term (e.g., a distortion error voltage) that is approximately equal in magnitude and opposite in sign to an error term produced by the conductivity modulation of resistors coupled to the input of the amplifier 304. For example, the reference amplifier 308 may introduce additional voltage in the feedback voltage ($V_{FB}$) to cancel (or substantially reduce) the distortion caused by the modulation, as described with respect to FIG. 3.

Figure 3:
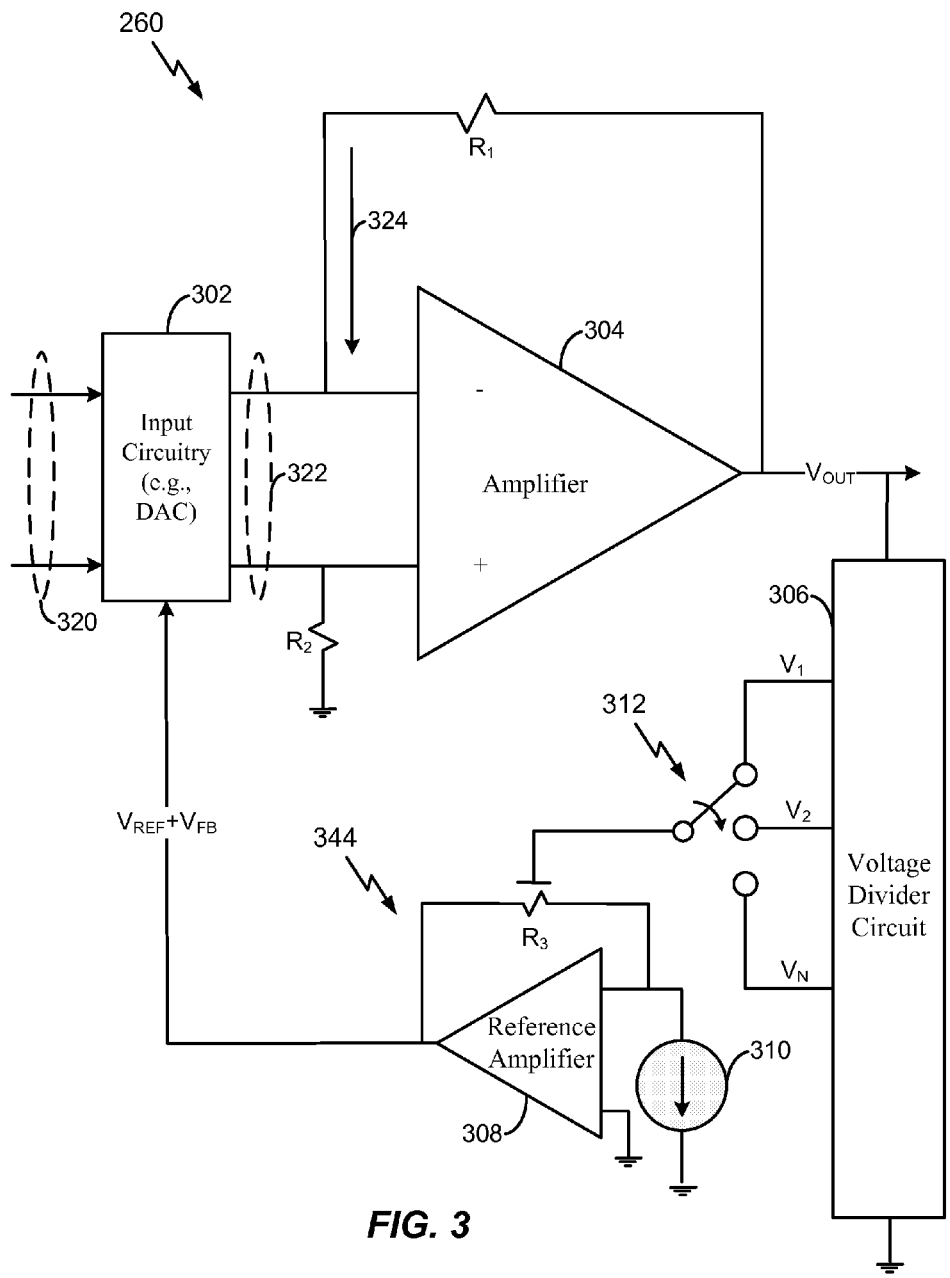
FIG. 3 is a diagram that depicts an exemplary embodiment of the coder/decoder (CODEC) of the wireless device of FIG. 2.

Referring to FIG. 3, an exemplary embodiment of the CODEC 260 is shown. The CODEC 260 includes the DAC 302, the amplifier 304, the voltage divider circuit 306, and the reference amplifier 308. The CODEC 260 may be operable to reduce distortion caused by one or more resistors having signal-dependent body voltages in the presence of a common mode voltage swing at an input of a power amplifier (e.g., the amplifier 304) to improve (e.g., reduce) total harmonic distortion (THD) of the output voltage signal (Vout). For example, conductivity modulation of the resistor(s) (e.g., a poly-depletion effect) may cause distortion based on the common mode voltage swing.

The DAC 302 may be configured to convert an input digital audio signal 320 (e.g., a digital stream) into an input analog audio signal 322. In an exemplary embodiment, the input digital audio signal 320 may be a differential signal. In another exemplary embodiment, the input digital audio signal 320 may be a single-ended signal. The DAC 302 may also be configured to receive a reference voltage signal ($V_{REF}$) and a feedback voltage signal ($V_{FB}$) from the reference amplifier 308. As explained below, a voltage of the feedback voltage signal ($V_{FB}$) may add a distortion error term (e.g., a distortion error voltage) to reduce distortion caused by one or more resistors having signal-dependent body voltages in the presence of the common voltage swing at the input of the amplifier 304 (e.g., an audio amplifier).

The DAC 302 may be configured to scale the reference voltage ($V_{REF}$) to generate the input analog audio signal 322 based on the input digital audio signal 320. For example, the DAC 302 may provide a portion of the reference voltage ($V_{REF}$) as the input analog audio signal 322. To illustrate, in an exemplary embodiment, the DAC 302 may be a resistive DAC (RDAC) and may function as a potentiometer divider. For example, the DAC 302 may include a parallel resistor network, and individual resistors in the parallel resistor network may be enabled or bypassed based on the input digital audio signal 320. In another exemplary embodiment, the DAC 302 may be a current DAC. For example, the DAC 302 may include multiple current sources that are selected based on the input digital audio signal 320. In another exemplary embodiment, the DAC 302 may be a capacitor DAC. For example, the DAC 302 may include multiple parallel capacitor networks. Individual capacitors in the parallel capacitor networks may be connected (or disconnected) via switches that are based on the input digital audio signal 320.

The DAC 302 may correspond to input circuitry of the amplifier 304. For example, the DAC 302 may provide the input analog audio signal 322 to the amplifier 304. The amplifier 304 (e.g., a power amplifier and/or an audio amplifier) may amplify the input analog audio signal 322 to generate the output voltage signal (Vout).

A first input of the amplifier 304 may receive a feedback signal 324 based on the output voltage signal (Vout) via a feedback path. The feedback signal 324 may include the output voltage signal (Vout) and may cause the virtual ground (e.g., input of the amplifier 304) to have a common mode swing. The feedback path may include a resistor ($R_1$) (e.g., a feedback resistor) having a first terminal coupled to the output of the amplifier 304 and having a second terminal coupled to the first input of the amplifier 304. A first terminal of a resistor ($R_2$) may be coupled to the second terminal of the amplifier 304, and a second terminal of the resistor ($R_2$) may be coupled to ground. In another exemplary embodiment, the second terminal of the resistor (R2) may be coupled to a sense voltage as opposed to being coupled to ground.

The feedback signal 324 may generate a common voltage swing at the first input of the amplifier 304. A resistor having a signal-dependent body voltage in the presence of the common mode voltage swing may increase the THD of the output voltage signal (Vout). For example, the conductivity of the resistor ($R_1$) (e.g., the voltage across the resistor (R1) or the "body voltage" of the resistor ($R_1$)) may be based on the output voltage signal (Vout). As used herein, "body voltage" may correspond to an average voltage at the terminals of a resistor (e.g., the voltage across the resistor). The body voltage of the resistor ($R_1$) and the body voltage of the resistor ($R_2$) may be dependent on the output voltage signal (Vout); however, the scaling factor for the resistor ($R_1$) and the scaling factor for the resistor ($R_2$) may differ. As a result, the body voltage of the resistor ($R_1$) and the body voltage of the resistor ($R_2$) may differ, which may cause distortion. For example, the signal-dependent body voltage modulation of the resistor ($R_1$) may vary based on the output voltage signal (Vout) and may generate nonlinearities (e.g., harmonic distortion) at the output of the amplifier 304.

To compensate for the nonlinearities at the output of the amplifier 304 based on the modulation of the resistors ($R_1$, $R_2$) body voltage, the voltage divider circuit 306 and the reference amplifier 308 may adjust the feedback voltage ($V_{FB}$) to cancel (or substantially reduce) the nonlinearities (e.g., distortion) generated by the modulation of the resistors ($R_1$, $R_2$) body voltage. The voltage divider circuit 306 may have a first terminal coupled to receive the output voltage signal (Vout) and a second terminal coupled to ground (or the common mode voltage). The voltage divider circuit 306 may be configured to provide a bias voltage (based on the output voltage signal (Vout)) to a shield (e.g., a well) of a resistor ($R_3$) to vary the resistance of the resistor ($R_3$). In an exemplary embodiment, the resistor ($R_3$) may be comprised of substantially similar "unit elements" as the resistor ($R_1$) and the resistor ($R_2$) such that the distortion error term (e.g., the feedback voltage ($V_{FB}$)) accurately matches the conductivity modulation at the amplifier 304 input. For example, because the resistors ($R_1$, $R_2$, $R_3$) are within a relatively close proximity, have similar dimensions, and are comprised of substantially similar material (e.g., poly-silicon), body voltage modulations of the resistors ($R_1$, $R_2$) caused by temperature and process variations may be substantially offset by body voltage modulations of the resistor ($R_3$) caused by the temperature and process variations to improve conductivity modulation matching.

To illustrate, the voltage divider circuit 306 may have a first terminal selectively coupled to provide a first voltage ($V_1$) to the resistor ($R_3$), a second terminal selectively coupled to provide a second voltage ($V_2$) to the resistor ($R_3$), and an $N^{th}$ terminal selectively coupled to provide an $N^{th}$ voltage ($V_N$) to the resistor ($R_3$). In an exemplary embodiment, N may be equal to any integer value that is greater than two. For example, if N is equal to twelve, the voltage divider circuit 306 may have twelve terminals that may be selectively coupled to provide voltages to the resistor ($R_3$). For any particular voltage level of the output voltage signal (Vout), the first voltage ($V_1$) is greater than the second voltage ($V_2$), and the second voltage ($V_2$) is greater than the $N^{th}$ voltage ($V_N$).

Figure 4:
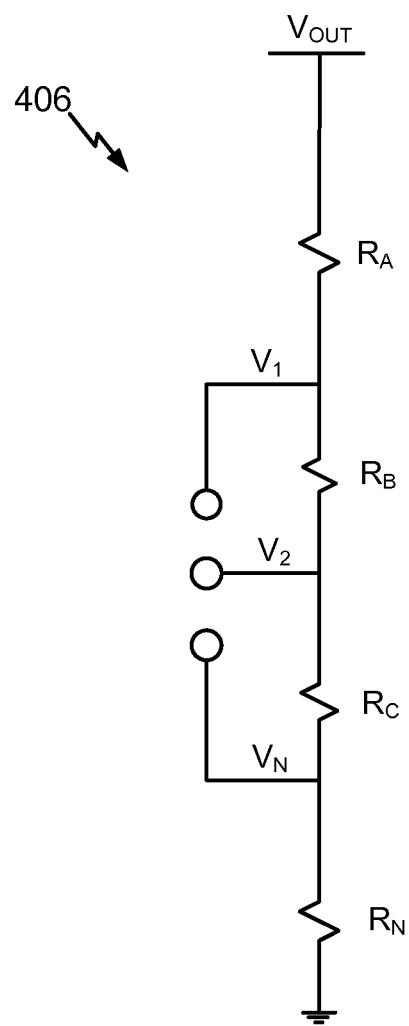
FIG. 4 is a diagram that depicts an exemplary embodiment of the voltage divider circuit of FIGS. 2-3.

The voltage divider circuit 306 may be implemented in a plurality of configurations. Referring to FIG. 4, an exemplary embodiment of a voltage divider circuit 406 is shown. The voltage divider circuit 406 may correspond to the voltage divider circuit 306 of FIGS. 2-3.

In the illustrated embodiment, the voltage divider circuit 406 may be implemented using serially coupled resistors (e.g., a resistive voltage divider circuit). For example, the voltage divider circuit 406 includes a first resistor ($R_A$), a second resistor ($R_B$), a third resistor ($R_C$), and an $N^{th}$ resistor ($R_N$). A first terminal of the first resistor ($R_A$) may be coupled to receive the output voltage signal (Vout), and a second terminal of the first resistor ($R_A$) may be coupled to a first terminal of the second resistor ($R_B$). A second terminal of the second resistor ($R_B$) may be coupled to a first terminal of the third resistor ($R_C$), and a second terminal of the third resistor ($R_C$) may be coupled to a first terminal of the $N^{th}$ resistor ($R_N$). A second terminal of the $N^{th}$ resistor ($R_N$) may be coupled to ground.

The $N^{th}$ voltage ($V_N$) may be approximately equal to the voltage across the $N^{th}$ resistor ($R_N$), the second voltage ($V_2$) may be approximately equal to the sum of the voltages across the $N^{th}$ resistor ($R_N$) and the third resistor ($R_C$), and the first voltage ($V_1$) may be approximately equal to the sum of the voltages across the $N^{th}$ resistor ($R_N$), the third resistor ($R_C$), and the second resistor ($R_B$). As explained below, a switch 312 of FIG. 3 may selectively bias a resistor ($R_3$) with either the first voltage ($V_1$), the second voltage ($V_2$), or the $N^{th}$ voltage ($V_N$) to generate the feedback voltage ($V_{FB}$) for voltage swing compensation at the first input of the amplifier 304.

Figure 5:
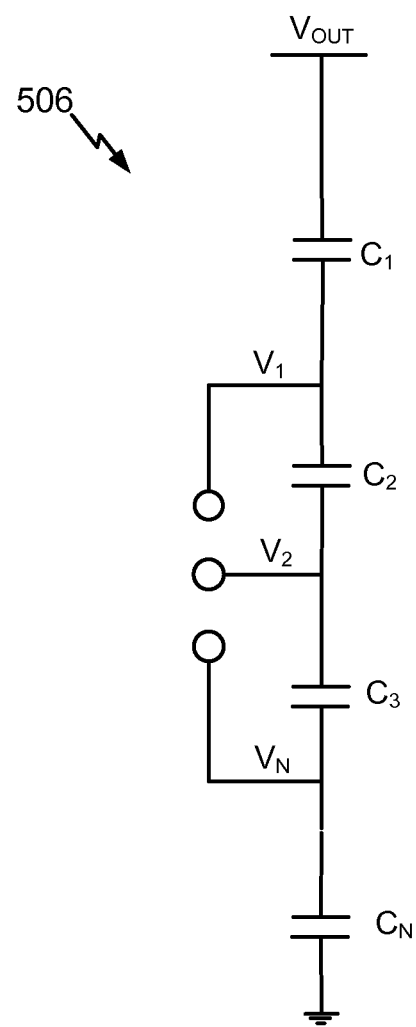
FIG. 5 is a diagram that depicts another exemplary embodiment of the voltage divider circuit of FIGS. 2-3.

Referring to FIG. 5, another exemplary embodiment of a voltage divider circuit 506 is shown. The voltage divider circuit 506 may correspond to the voltage divider circuit 306 of FIGS. 2-3.

In the illustrated embodiment, the voltage divider circuit 406 may be implemented using serially coupled capacitors (e.g., a capacitive voltage divider circuit). For example, the voltage divider circuit 406 includes a first capacitor ($C_1$), a second capacitor ($C_2$), a third capacitor ($C_3$), and an $N^{th}$ capacitor ($C_N$). A first terminal of the first capacitor ($C_1$) may be coupled to receive the output voltage signal (Vout), and a second terminal of the first capacitor ($C_1$) may be coupled to a first terminal of the second capacitor ($C_2$). A second terminal of the second capacitor ($C_2$) may be coupled to a first terminal of the third capacitor ($C_3$), and a second terminal of the third capacitor ($C_3$) may be coupled to a first terminal of the $N^{th}$ capacitor ($C_N$). A second terminal of the $N^{th}$ capacitor ($C_N$) may be coupled to ground.

The $N^{th}$ voltage ($V_N$) may be approximately equal to the voltage across the $N^{th}$ capacitor ($C_N$), the second voltage ($V_2$) may be approximately equal to the sum of the voltages across the $N^{th}$ capacitor ($C_N$) and the third capacitor ($C_3$), and the first voltage ($V_1$) may be approximately equal to the sum of the voltages across the $N^{th}$ capacitor ($C_N$), the third capacitor ($C_3$), and the second capacitor ($C_2$). As explained below, the switch 312 of FIG. 3 may selectively bias the resistor ($R_3$) with either the first voltage ($V_1$), the second voltage ($V_2$), or the $N^{th}$ voltage ($V_N$) to generate the feedback voltage ($V_{FB}$) for voltage swing compensation at the first input of the amplifier 304.

Referring to FIG. 3, a switch 312 may selectively couple the first terminal, the second terminal, or the $N^{th}$ terminal of the voltage divider circuit 306 to provide the first voltage ($V_1$), the second voltage ($V_2$), or the $N^{th}$ voltage ($V_N$), respectively, to the shield of the resistor ($R_3$) (e.g., the well of the resistor ($R_3$)). In an exemplary embodiment, the switch 312 may be controlled via the data processor/controller 280 of FIG. 2. For example, the data processor/controller 280 may provide a digital signal (not shown) to control operation of the switch 312. In an exemplary embodiment, the voltage provided to the shield of the resistor (R3) may be based on the gain of the amplifier 304. For example, when the gain of the amplifier 304 increases (e.g., the voltage of the output voltage signal (Vout) increases), the switch 312 may couple to a terminal of the voltage divider circuit 306 associated with a lower voltage. To illustrate, if the gain of the amplifier 304 is relatively high, the switch 312 may couple to the $N^{th}$ terminal to provide the Nth voltage ($V_N$) to the shield of the resistor ($R_3$). When the gain of the amplifier 304 decreases (e.g., the voltage of the output voltage signal (Vout) decreases), the switch 312 may couple to a terminal associated with a higher voltage. To illustrate, if the gain of the amplifier 304 is relatively low, the switch 312 may couple to the first terminal to provide the first voltage ($V_1$) to the shield of the resistor ($R_3$). Providing a voltage (e.g., one of $V_1$-$V_N$) to the shield of the resistor ($R_3$) may vary the effective resistance of the resistor ($R_3$). For example, providing the voltage to the shield of the resistor ($R_3$) may change the depletion of carriers at the body of the resistor ($R_3$), which in turn may change the resistivity of the resistor ($R_3$).

Although the switch 312 may couple to the first terminal when the gain of the amplifier 304 decreases in the above-indicated example, it should be understood that the voltage provided to the shield of the resistor ($R_3$) is not necessarily higher than the voltage provided to the shield of the resistor ($R_3$) when the switch 312 couples to the $N^{th}$ terminal when the gain of the amplifier 304 increases. For example, when the gain of the amplifier 304 is relatively high (e.g., the voltage of the output voltage signal (Vout) is relatively high), the $N^{th}$ voltage ($V_N$) may be greater than a voltage level of the first voltage ($V_1$) when the gain of the amplifier 304 is relatively low (e.g., the voltage of the output voltage signal (Vout) is relatively low). Thus, the $N^{th}$ voltage ($V_N$) (when the output voltage signal (Vout) has a high voltage level) may be greater than the first voltage ($V_1$) (when the output voltage signal (Vout) has a low voltage level).

The reference amplifier 308 may be coupled to the voltage divider circuit 306 to adjust the feedback voltage ($V_{FB}$). For example, a current source 310 may be coupled to a first terminal of the reference amplifier 308 and to ground, and a second terminal of the reference amplifier 308 may be coupled to ground. The current source 310 may generate a current that propagates through the resistor (R3) (e.g., propagates through a feedback path 344 of the reference amplifier 308) to adjust the feedback voltage ($V_{FB}$) based on the body voltage of the resistor ($R_3$). In another exemplary embodiment, the current source 310 may be replaced by a voltage source coupled to a resistor to generate a current that propagates through the resistor ($R_3$).

Adjusting the feedback voltage ($V_{FB}$) by biasing the body voltage of the resistor ($R_3$) based on a voltage provided by the voltage divider circuit 306 may cancel (or substantially reduce) the distortion caused by the modulation of the resistor ($R_1$) body voltage.

For example, the body voltage of the resistor ($R_3$) may be based on the output voltage signal (Vout). Based on the resistor ($R_3$), the reference amplifier 308 may generate the feedback voltage ($V_{FB}$) such that distortion (based on the body voltage modulation of the resistor ($R_1$)) at the common mode input of the amplifier 304 is cancelled (or substantially reduced). For example, the feedback voltage ($V_{FB}$) (e.g., the distortion error voltage signal) may be approximately equal in magnitude and opposite in sign to an error term produced by the conductivity modulation of resistors ($R_1$, $R_2$) coupled to the input of the amplifier 304. Thus, the feedback voltage ($V_{FB}$) may introduce additional voltage to cancel (or substantially reduce) the distortion caused by the modulation.

It will also be appreciated that biasing the resistor ($R_3$) body voltage may account for temperature and process variations at the CODEC 260 that may increase THD of the output voltage signal (Vout). For example, the body voltage of the resistor ($R_1$) may vary based on temperature and process variations at the CODEC 260, which may increase the THD. However, body voltage variations of the resistor ($R_1$) based on temperature and process variations may be substantially similar to body voltage variations of the resistor ($R_3$) based on the temperature and process variations. For example, because the resistors ($R_1$, R2, $R_3$) are within a relatively close proximity and are comprised of substantially similar material (e.g., poly-silicon) and are comprised of the same unit elements, body voltage modulations of the resistor ($R_1$) caused by temperature and process variations may be substantially offset by body voltage modulations of the resistor ($R_3$) caused by the temperature and process variations.

Figure 6:
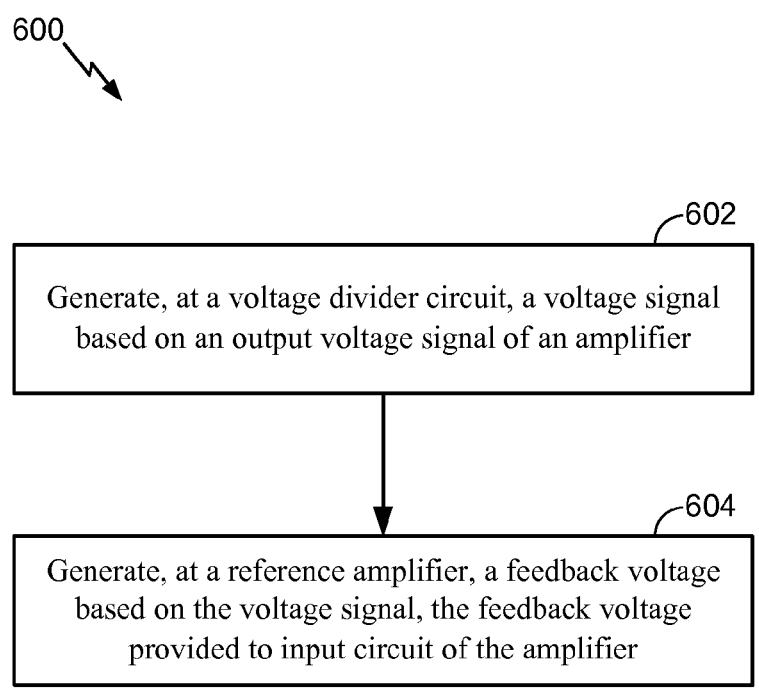
FIG. 6 is a flowchart that illustrates an exemplary embodiment of a method for generating a feedback voltage to cancel distortion at an amplifier.

Referring to FIG. 6, a flowchart that illustrates an exemplary embodiment of a method 600 for generating a feedback voltage to reduce distortion at an amplifier is shown. In an illustrative embodiment, the method 600 may be performed by components of the CODEC 260 of FIGS. 2-3, the voltage divider circuit 406 of FIG. 4, the voltage divider circuit 506 of FIG. 5, or any combination thereof.

The method includes generating, at a voltage divider circuit, a voltage signal based on an output voltage signal of an amplifier, at 602. For example, referring to FIG. 3, the voltage divider circuit 306 may generate the first voltage ($V_1$), the second voltage ($V_2$), and the $N^{th}$ voltage ($V_N$) based on the output voltage signal (Vout) of the amplifier 304.

A feedback voltage may be generated at a reference amplifier based on the voltage signal, at 604. For example, referring to FIG. 3, the reference amplifier 308 may generate the feedback voltage ($V_{FB}$) based on the voltage signal (e.g., the first voltage ($V_1$), the second voltage ($V_2$), and the $N^{th}$ voltage ($V_N$)) provided to the shield of the resistor ($R_3$). To illustrate, the switch 312 may selectively couple to the first terminal, the second terminal, or the $N^{th}$ terminal so that the first voltage ($V_1$), the second voltage ($V_2$), or the $N^{th}$ voltage ($V_N$), respectively, may bias the resistor ($R_3$). Biasing the resistor ($R_3$) may change the depletion of carriers at the body of the resistor ($R_3$), which in turn may change the resistivity of the resistor ($R_3$). The current source 310 may generate the current that propagates through the resistor ($R_3$) (e.g., propagates through a feedback path of the reference amplifier 308) to adjust the feedback voltage ($V_{FB}$) based on the body voltage of the resistor ($R_3$).

The method 600 of FIG. 6 may introduce additional voltage in the feedback voltage ($V_{FB}$) to substantially cancel the distortion caused by the modulation of the resistor ($R_1$) body voltage. For example, the body voltage of the resistor ($R_3$) may be biased based on the output voltage signal (Vout). Based on the biased resistor ($R_3$), the reference amplifier 308 may generate the feedback voltage ($V_{FB}$) such that distortion (based on the body voltage modulation of the resistor ($R_1$)) at the common mode input of the amplifier 304 is substantially cancelled.

In conjunction with the described embodiments, an apparatus includes means for generating a voltage signal based on an output voltage signal. For example, the means for generating the voltage signal may correspond to the voltage divider circuit 306 of FIGS. 2-3, the voltage divider circuit 406 of FIG. 4, the voltage divider circuit 506 of FIG. 5, one or more other devices, circuits, modules, or any combination thereof.

The apparatus may also include means for generating a feedback voltage signal coupled to the means for generating the voltage signal. The feedback voltage signal may be provided to input circuitry of means for amplifying an input signal. For example, the means for generating the feedback voltage signal may include the reference amplifier 308 of FIGS. 2-3, one or more other devices, circuits, modules, or any combination thereof. The means for amplifying the input signal may include the amplifier 304 of FIGS. 2-3, one or more other devices, circuits, modules, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. For example, digital codes provided to the DAC 302 and/or the switch 312 may be implemented using software that is executable by a processor. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a voltage divider circuit configured to generate a voltage signal based on an output voltage signal of an amplifier;
   a reference amplifier coupled to the voltage divider circuit and configured to provide a feedback voltage to input circuitry of the amplifier; and
   a feedback resistor coupled to an output of the reference amplifier, wherein a resistance of the feedback resistor is based on the voltage signal.

2. The apparatus of claim 1, wherein the voltage divider circuit includes a plurality of capacitors.

3. The apparatus of claim 1, wherein the voltage divider circuit includes a plurality of resistors.

4. The apparatus of claim 1, wherein the voltage divider circuit is further coupled to an output of the amplifier.

5. The apparatus of claim 1, wherein a shield of the feedback resistor is configured to receive the voltage signal from the voltage divider circuit.

6. The apparatus of claim 1, further comprising a switch configured to provide the voltage signal from the voltage divider circuit to the feedback resistor.

7. The apparatus of claim 1, wherein the input circuitry comprises a digital-to-analog converter.

8. The apparatus of claim 1, wherein the amplifier comprises an operational amplifier.

9. The apparatus of claim 1, wherein the amplifier comprises an audio amplifier.

10. An apparatus comprising:
   means for generating a voltage signal based on an output voltage signal generated by means for amplifying an input signal;
   means for generating a feedback voltage signal coupled to the means for generating the voltage signal, the feedback voltage signal provided to input circuitry of the means for amplifying the input signal; and
   means for resisting current coupled to an output of the means for generating the feedback voltage, wherein a resistance of the means for resisting current is based on the voltage signal.

11. The apparatus of claim 10, wherein the means for generating the voltage signal includes a voltage divider that includes a plurality of capacitors or a plurality of resistors.

12. The apparatus of claim 10, further comprising means for switching configured to provide the voltage signal to the means for resisting current.

13. The apparatus of claim 10, wherein a shield of the means for resisting current is configured to receive the voltage signal.

14. A method comprising:
   generating, at a voltage divider circuit, a voltage signal based on an output voltage signal of an amplifier;
   generating, at an output of a reference amplifier, a feedback voltage based on a summation of the voltage signal and a reference voltage, the feedback voltage provided to an input circuit of the amplifier; and
   modifying a resistance of a feedback resistor coupled to the output of the reference amplifier, wherein the resistance is based on the voltage signal.

15. The method of claim 14, wherein the voltage divider circuit includes a plurality of capacitors or a plurality of resistors.

16. The method of claim 14, further comprising biasing the feedback resistor using the voltage signal.

17. The method of claim 14, further comprising reducing total harmonic distortion at an input of the amplifier based on the feedback voltage.

18. The apparatus of claim 1, further comprising a current source coupled to the reference amplifier and configured to generate a reference current.

19. The apparatus of claim 1, wherein the reference amplifier includes a first input that is coupled to a current source and a second input that is coupled to ground.

* * * * *